(12) United States Patent
Song et al.

(10) Patent No.: US 8,026,543 B2
(45) Date of Patent: Sep. 27, 2011

(54) SEMICONDUCTOR DEVICES HAVING PHASE CHANGE MEMORY CELLS, ELECTRONIC SYSTEMS EMPLOYING THE SAME AND METHODS OF FABRICATING THE SAME

(75) Inventors: Yoon-Jong Song, Seoul (KR); Young-Nam Hwang, Gyeonggi-do (KR); Sang-Don Nam, Seoul (KR); Sung-Lae Cho, Gyeonggi-do (KR); Gwan-Hyeob Koh, Seoul (KR); Choong-Man Lee, Gyeonggi-do (KR); Bong-Jin Kuh, Gyeonggi-do (KR); Yong-Ho Ha, Gyeonggi-do (KR); Su-Youn Lee, Gyeonggi-do (KR); Chang-Wook Jeong, Seoul (KR); Ji-Hye Yi, Gyeonggi-do (KR); Kyung-Chang Ryoo, Gyeonggi-do (KR); Se-Ho Lee, Seoul (KR); Su-Jin Ahn, Seoul (KR); Soon-Oh Park, Gyeonggi-do (KR); Jang-Eun Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/338,814

(22) Filed: Dec. 18, 2008

(65) Prior Publication Data
US 2009/0101881 A1 Apr. 23, 2009

Related U.S. Application Data

(60) Division of application No. 11/139,283, filed on May 27, 2005, now Pat. No. 7,482,616, which is a continuation-in-part of application No. 11/027,255, filed on Dec. 30, 2004, now Pat. No. 7,411,208.

(30) Foreign Application Priority Data

May 27, 2004 (KR) .................................. 2004-37965
Dec. 14, 2004 (KR) ................................ 2004-105905
Apr. 15, 2005 (KR) .................................. 2005-31662

(51) Int. Cl.
H01L 27/108 (2006.01)
H01L 47/00 (2006.01)
(52) U.S. Cl. ...... 257/296; 257/4; 257/300; 257/E45.002
(58) Field of Classification Search .................. 257/296, 257/300, E45.002
See application file for complete search history.

(56) References Cited

U.S. PATENT DOCUMENTS
4,115,872 A 9/1978 Bluhm
(Continued)

FOREIGN PATENT DOCUMENTS
CN 1506973 A 6/2004
(Continued)

OTHER PUBLICATIONS

Gu, Si-peng, et al., Optical Properties of Ge-Sb-Te-O Phase-Change Films, Optical Instruments, Dec. 2001, pp. 23-26, vol. 23, No. 5-6, China Academic Journal, China.

*Primary Examiner* — Kenneth Parker
*Assistant Examiner* — Jose R Diaz
(74) *Attorney, Agent, or Firm* — Volentine & Whitt, PLLC

(57) ABSTRACT

A phase-change memory device has an oxidation barrier layer to protect against memory cell contamination or oxidation. In one embodiment, a semiconductor memory device includes a molding layer disposed over semiconductor substrate, a phase-changeable material pattern, and an oxidation barrier of electrically insulative material. The molding layer has a protrusion at its upper portion. One portion of the phase-changeable material pattern overlies the protrusion of the molding layer, and another portion of the phase-changeable material pattern extends through the protrusion. The electrically insulative material of the oxidation barrier may cover the phase-changeable material pattern and/or extend along and cover the entire area at which the protrusion of the molding layer and the portion of the phase-change material pattern disposed on the protrusion adjoin.

20 Claims, 16 Drawing Sheets

U.S. PATENT DOCUMENTS

| | | |
|---|---|---|
| 4,366,614 A | 1/1983 | Kumurdjian |
| 4,499,557 A | 2/1985 | Holmberg et al. |
| 4,599,705 A | 7/1986 | Holmberg et al. |
| 5,177,567 A | 1/1993 | Klersy et al. |
| 5,952,671 A | 9/1999 | Reinberg et al. |
| 6,147,395 A | 11/2000 | Gilgen |
| 6,189,582 B1 | 2/2001 | Reinberg et al. |
| 6,337,266 B1 | 1/2002 | Zahorik |
| 6,531,391 B2 | 3/2003 | Zahorik |
| 6,635,951 B1 | 10/2003 | Zahorik |
| 6,642,102 B2 | 11/2003 | Xu |
| 6,670,713 B2 * | 12/2003 | Gonzalez et al. ............ 257/758 |
| 6,689,664 B2 | 2/2004 | Park |
| 6,744,088 B1 | 6/2004 | Dennison |
| 6,806,528 B2 | 10/2004 | Lee et al. |
| 6,858,482 B2 | 2/2005 | Gilton |
| 7,037,749 B2 | 5/2006 | Horii et al. |
| 7,042,001 B2 | 5/2006 | Kim et al. |
| 7,105,396 B2 | 9/2006 | Hwang et al. |
| 2002/0132417 A1 | 9/2002 | Li |
| 2003/0082908 A1 | 5/2003 | Lowrey |
| 2003/0209746 A1 | 11/2003 | Horii |
| 2003/0219924 A1 | 11/2003 | Bez et al. |
| 2003/0231530 A1 | 12/2003 | Bez et al. |
| 2004/0087074 A1 | 5/2004 | Hwang et al. |
| 2005/0018526 A1 * | 1/2005 | Lee ................................ 365/232 |
| 2005/0263801 A1 | 12/2005 | Park et al. |

FOREIGN PATENT DOCUMENTS

| | | |
|---|---|---|
| DE | 2822264 C2 | 12/1978 |
| DE | 3046721 A1 | 10/1981 |
| DE | 10351017 A1 | 5/2004 |
| JP | 2000-091524 | 3/2000 |
| JP | 2002-151688 | 5/2002 |
| JP | 2003-298013 | 10/2003 |
| JP | 2003-318286 | 11/2003 |
| KR | 2003-0081900 A | 10/2003 |
| KR | 1020030086820 A | 11/2003 |
| KR | 1020040017694 A | 2/2004 |

* cited by examiner

SEMICONDUCTOR DEVICES HAVING PHASE CHANGE MEMORY CELLS, ELECTRONIC SYSTEMS EMPLOYING THE SAME AND METHODS OF FABRICATING THE SAME

CROSS-REFERENCE TO RELATED APPLICATION

The present application is a divisional of U.S. patent application Ser. No. 11/139,283, filed May 27, 2005, now pending, which is a continuation-in-part of U.S. patent application Ser. No. 11/027,255, filed Dec. 30, 2004, issued on Aug. 12, 2008 as U.S. Pat. No. 7,411,208, which claims priority from Korean Patent Application No. 2004-37965, filed on May 27, 2004. Also, the present application claims the priority from Korean Patent Application Nos. 2004-105905 and 2005-31662, filed Dec. 14, 2004 and Apr. 15, 2005, respectively. The disclosures of all of the above applications are incorporated herein by reference in their entirety.

BACKGROUND OF THE INVENTION

1. Field of the Invention

The invention relates to a semiconductor memory device and methods of fabricating the same, and more particularly, to a phase-change memory device and methods of fabricating the same.

2. Description of Related Art

The use of phase-changeable materials for electronic memory applications is known in the art and is disclosed, for example, in U.S. Pat. No. 6,147,395 and U.S. Pat. No. 6,337,266. The two states of a memory, in the case of phase-changeable memory, depend on the resistance to current flow in a memory cell. The phase-changeable material typically has an amorphous phase and a crystalline phase, with inherent high and low electrical resistance, respectively. The amorphous phase exists at relatively high temperatures, and the crystalline phase exists at relatively low temperatures. Phase-changeable memory operates on the basic idea that memory cell states, i.e., "on" or "off", are dependent on temperature. Thus, means for setting the temperature high or low is incorporated in each memory cell.

A general structure for this type of memory includes a phase-changeable material sandwiched between a lower electrode and an upper electrode. The lower electrode typically plays two roles, one being the conduction electrode to the memory cell, and the other being an ohmic heater to control the phase of the phase-changeable material. As just described, the structure comprises interfaces between the top electrode and the phase-changeable material, and between the bottom electrode and the phase-changeable material. During a fabrication of the memory device, and during its operational life in use, these interfaces may become contaminated or oxidized. Such oxidation causes a large variation in the distribution of contact resistances at these interfaces. Since the operation of phase-changeable memory depends on distinguishing between the memory cell being "on" or "off" based on the cell's resistance to current flow, contamination or oxidation jeopardizes the accuracy of memory programming. A need still remains for a novel phase-change memory structure that can prevent such contamination or oxidation and the manufacturing method thereof.

SUMMARY OF THE INVENTION

A phase-change memory device has an oxidation barrier layer to protect against memory cell contamination or oxidation. In one embodiment, a semiconductor memory device comprises a molding layer overlying a semiconductor substrate. The molding layer has a protrusion portion vertically extending from a top surface thereof. The device further includes a phase-changeable material pattern adjacent the protrusion portion and a lower electrode electrically connected to the phase-changeable material pattern. According to one aspect of the present invention, an oxidation barrier layer may cover an area where a sidewall of the phase-changeable material pattern and a sidewall of the protrusion portion adjoin. More stable operation and a longer operational lifetime of the phase-change memory device are some of the benefits of the present invention.

DETAILED DESCRIPTION OF THE PREFERRED EMBODIMENTS

Figure 1A:
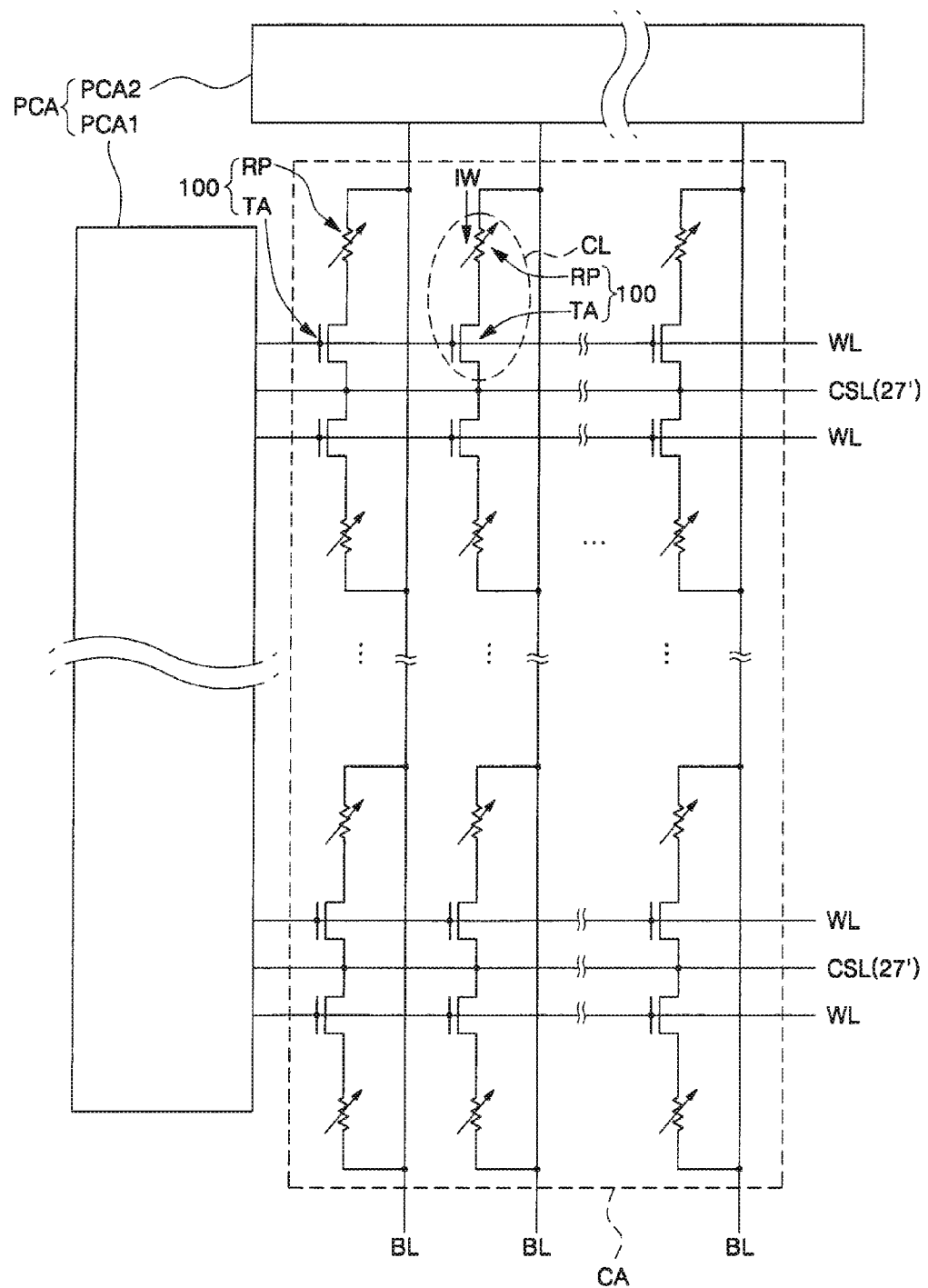
FIG. 1a is a schematic view of an embodiment that features a phase-change memory cell array (CA) and a peripheral circuit area (PCA) of the present invention.

FIG. 1a is a schematic view of an embodiment that features a phase-change memory cell array CA and a peripheral circuit area PCA of the present invention. The cell array area CA comprises an array of memory cells CL each of which in turn comprises an access transistor TA and a phase-change resistor RP. Each memory cell CL is connected to a bit line BL, a word line WL, and a common source line CSL in a configuration that is known in the art. Other conventional structures will be included in the present invention. For example, the peripheral circuit area PCA includes first and second integrated circuits PCA1, PCA2 to drive the memory cells CL. The state of a memory cell CL is determined by a current sensing of a writing current IW. The current sensing and other functions of memory control are known to one skilled in the art.

Figure 1B:
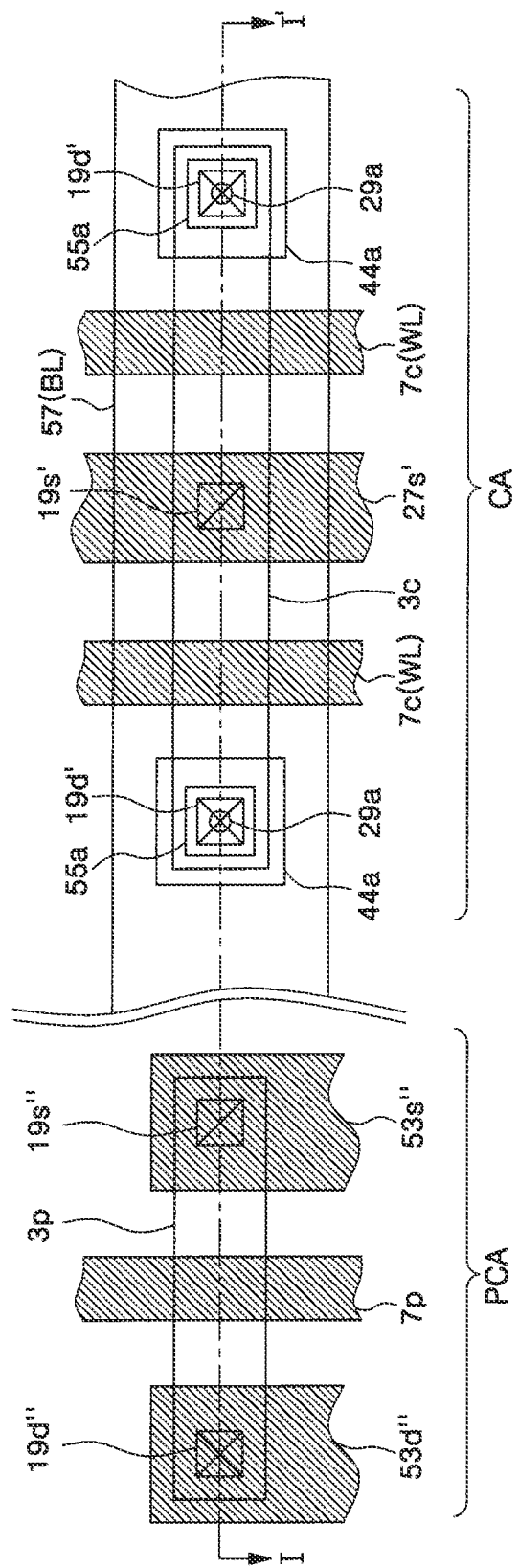
FIG. 1b is a plan view of a portion of a phase-change memory cell array area and peripheral circuit area according to an embodiment of the present invention.

FIG. 1b is a plan view of a portion of the phase-change memory cell array area CA and a portion of the peripheral circuit area PCA according to an embodiment of the invention. FIG. 1b shows a cell active region 3c, a common source line 27s' (which will be referred to as "common source pad 27s'" in the context of subsequent figures), cell gate electrodes 7c, a peripheral gate electrode 7p, a bit line 57, first and second source contact holes 19s' and 19s'', a bit line contact hole 55a, first and second drain contact holes 19d' and 19d'', a phase-change resistor 44a, and a phase-change resistor contact hole 29a. The details of these elements will be explained later.

FIGS. 2-9 are each a cross-sectional view taken along line I-I' of FIG. 1b showing a processing step of manufacturing an embodiment of the present invention.

Figure 2:
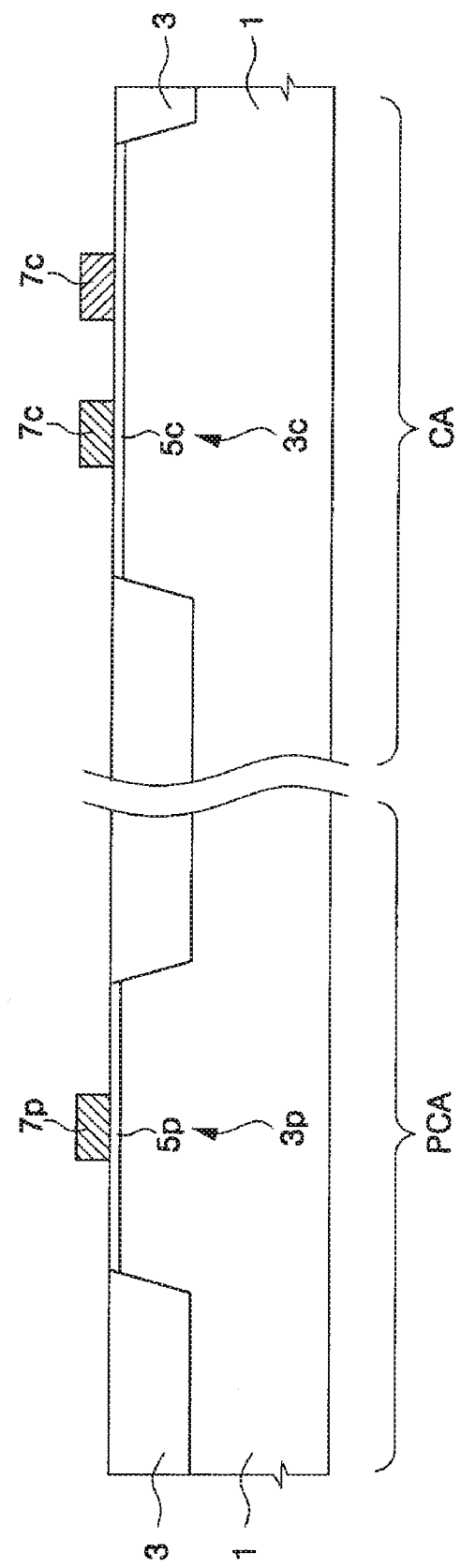
FIGS. 2-9 are each cross-sectional views taken along line I-I' of FIG. 1b showing processing steps of manufacturing an embodiment of the invention.

Referring to FIG. 2, the cell gate electrode 7c and the peripheral gate electrode 7p are respectively formed on a cell gate dielectric layer Sc in the cell active region 3c and on a peripheral gate dielectric layer 5p in a peripheral circuit active region 3p, defined by a field isolation region 3 that is formed on a semiconductor substrate 1. The widths of the cell gate electrode 7c and the peripheral gate electrode 7p may be different. Preferably, the width of the peripheral gate electrode 7p is at least about 1.5 times greater than that of the cell gate electrode 7c. Furthermore, the peripheral gate dielectric layer 5p may be formed to be thicker than the cell gate dielectric layer 5c.

Figure 3:
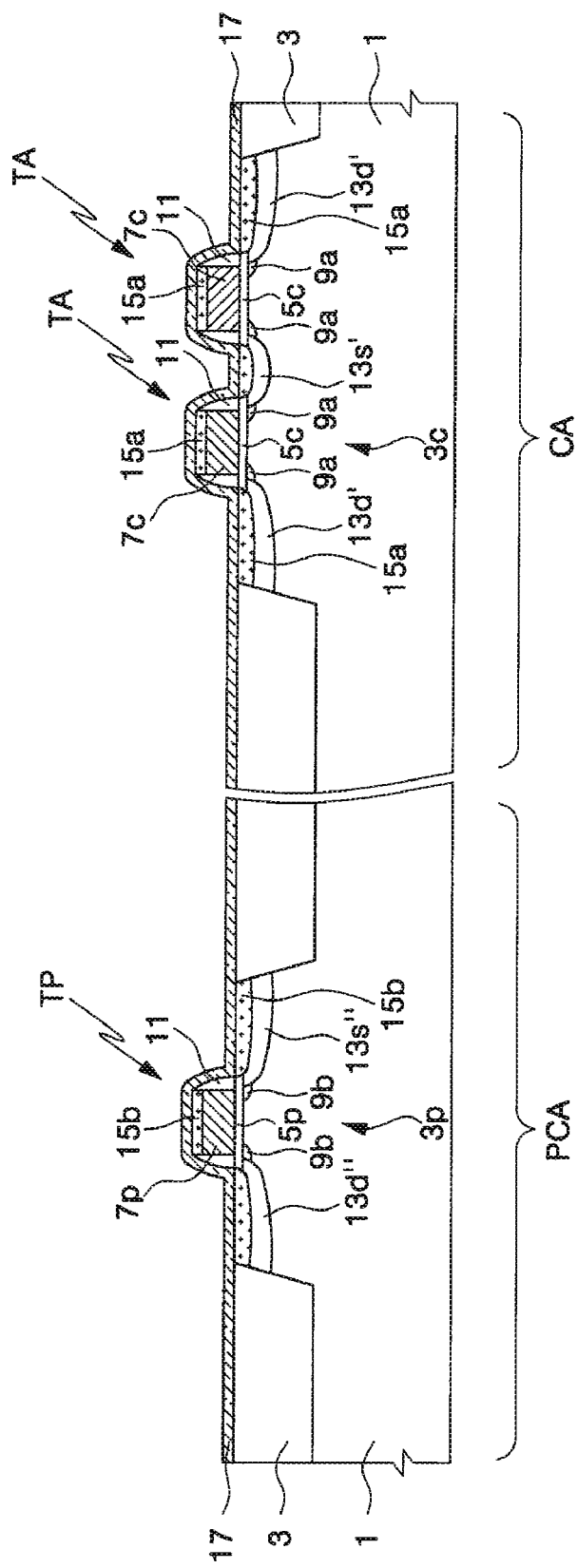

Referring to FIG. 3, a peripheral circuit MOS transistor TP and a cell access MOS transistor TA are formed. In detail, using the cell gate electrode 7c as an ion implantation mask, an n-type first low concentration impurity region 9a is formed in the cell active region 3c. Further, a p-type second low concentration impurity region 9b is formed in the peripheral circuit active region 3p, using the peripheral gate electrode 7p as an ion implantation mask.

Also, a gate spacer 11 of a conventional spacer material such as oxide or nitride is preferably formed along opposite sides of the cell gate electrode 7c and also along opposite sides of the peripheral gate electrode 7p, using conventional techniques.

Next, using the gate spacer 11, an n-type first source region 13s' and an n-type first drain region 13d' are formed in the cell active region 3c. In addition, a p-type second source region 13s''', and a p-type second drain region 13d''' are subsequently formed in the peripheral circuit active region 3p, using methods known in the art. As a result, a pair of access (switching) MOS transistors TA are formed in the cell area CA and a peripheral MOS transistor TP is formed in the peripheral circuit area PCA.

A silicide layer 15b may be formed on at least one of the second source and drain regions 13s''' and 13d''' and the peripheral gate electrode 7p. A silicide layer 15a may be formed on at least one of the first source and drain regions 13s' and 13d' and the cell gate electrode 7c. Then, a lower etch stopper 17 is formed over the resulting structure.

Figure 4:
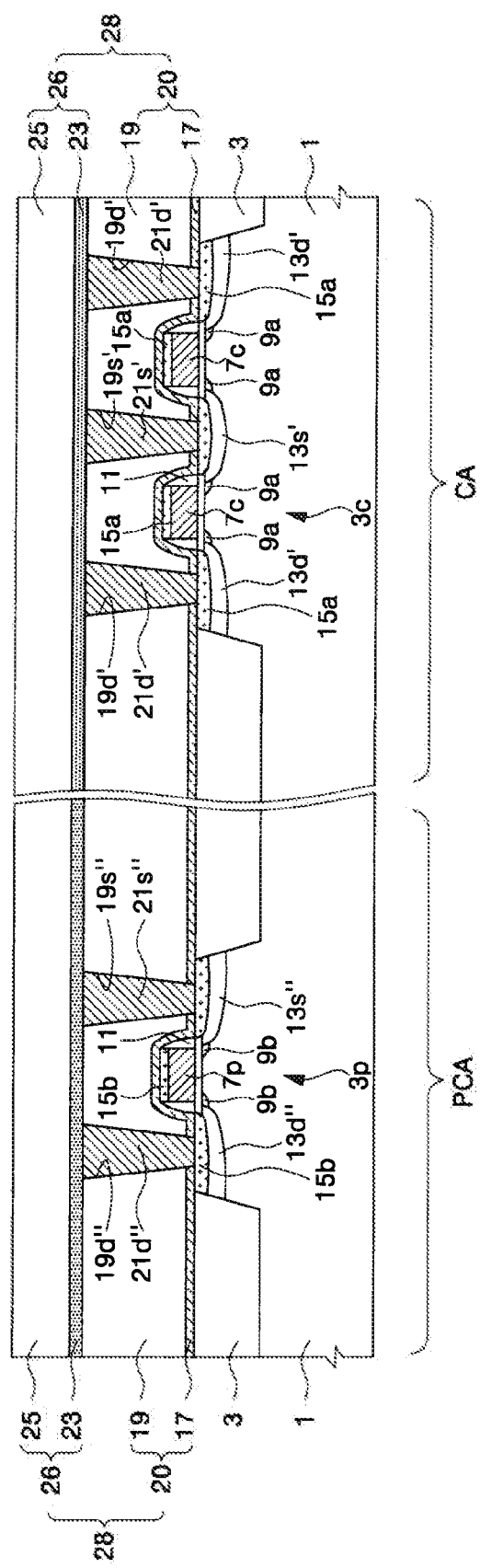

Referring to FIG. 4, a lower insulating layer 19 is formed over the lower etch stopper 17, both of which are combined to form a lower inter-level insulating layer 20.

Subsequently, the first source contact hole 19s', and the first drain contact hole 19d' are formed in the lower inter-level insulating layer 20 in the cell area CA. Then, a first source contact plug 21s' and a first drain contact plug 21d' are respectively formed in the first source contact hole 19s' and the first drain contact hole 19d', using methods known in the art. Also, the second source contact hole 19s''', the second drain contact hole 19d''', a second source contact plug 21s''', and a second drain contact plug 21d''' are formed in the peripheral circuit area PCA in the lower inter-level insulating layer 20, using conventional techniques.

Then, an upper inter-level insulating layer 26 is formed, comprising an upper etch stopper 23 and an upper insulating layer 25. Reference numeral 28 denotes an interlayer insulating layer comprising the layers 17, 19, 23, and 25 described above.

Figure 5:
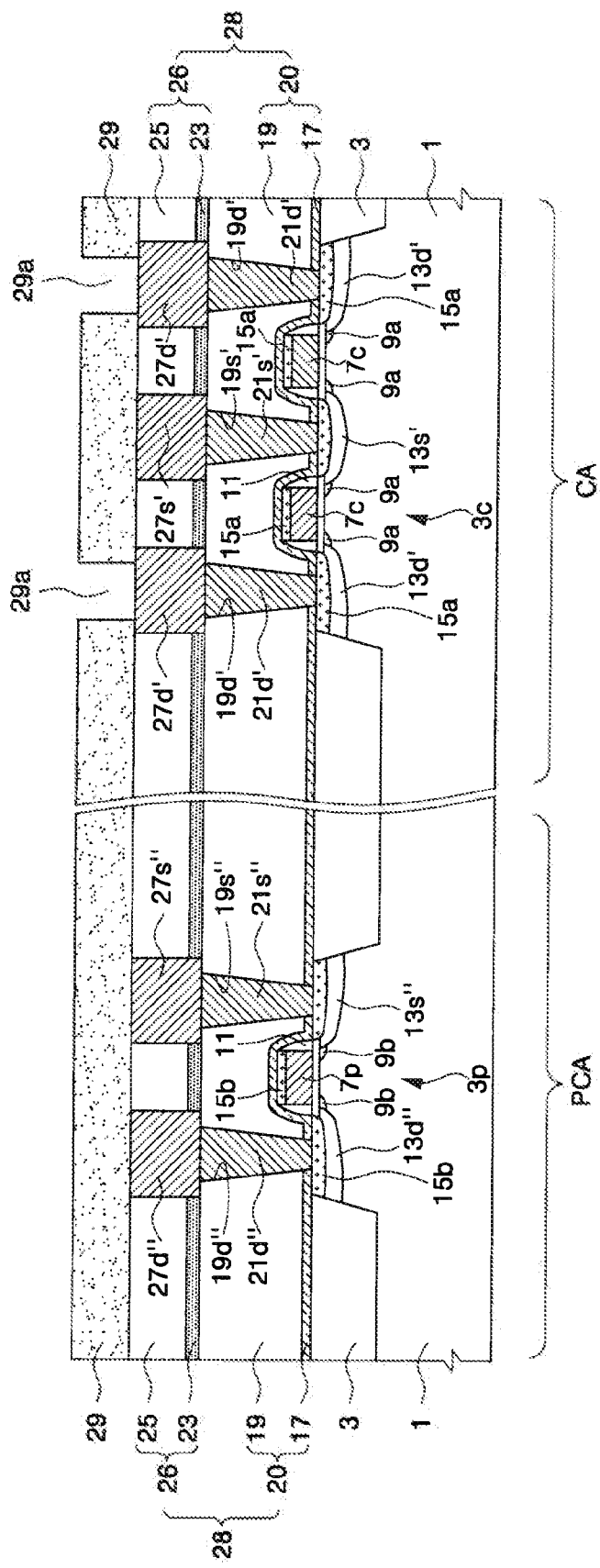

Referring to FIG. 5, a common source pad 27s', which represents a cross-section of the common source line 27s' in FIG. 1b, a conductive pad, i.e., a first drain pad 27d', a peripheral circuit region source pad 27s''', and a peripheral circuit region drain pad 27d''' are formed within the upper inter-level insulating layer 26 shown in FIG. 4. These elements are formed according to processes known to one skilled in the art. Consequently, the common source pad 27s' and the first drain pad 27d' are respectively electrically connected to the first source region 13s' and the first drain region 13d'.

Afterwards, a molding layer 29 is formed on the resulting structure. A phase-change resistor contact hole 29a is then formed in the molding layer 29, using photolithography and etching processes. The molding layer 29 is preferably formed of a material having a high thermal conductivity. For example, the molding layer 29 has a thermal conductivity higher than that of silicon oxide. This gives a high rapid quenching efficiency of a phase transition of a phase-changeable material pattern, in addition to an oxygen barrier characteristic to prevent the phase-changeable material pattern from being oxidized. Such materials include silicon nitride and silicon oxynitride, for example.

Figure 6:
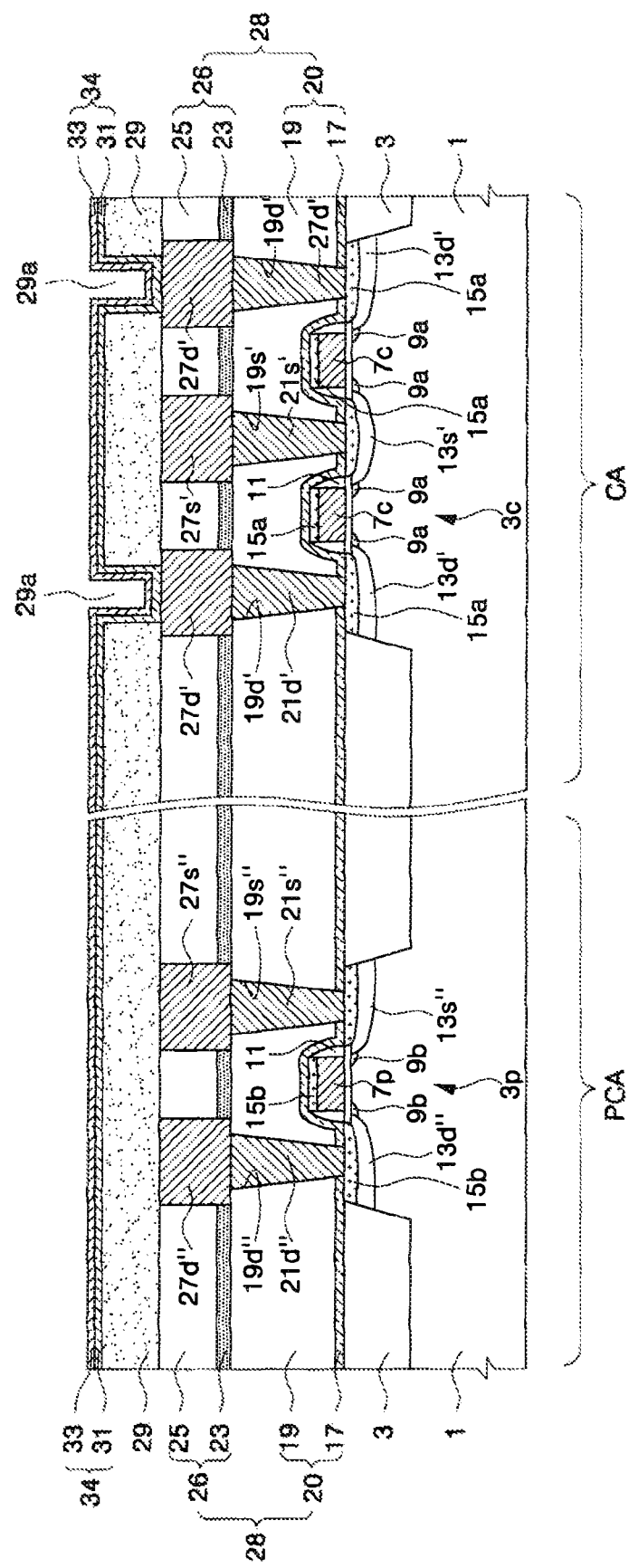

Turning to FIG. 6, a conformal contact spacer layer 34 may be formed of either one or two layers. Preferably, the conformal contact spacer layer 34 is formed under a vacuum without using an oxygen gas. If the oxygen gas is used to form the conformal contact spacer layer 34, to prevent the oxidation of the drain pad 27d', it is preferable to use a lower formation temperature. The conformal contact spacer layer 34 may be a silicon nitride layer formed using plasma-enhanced (PE) CVD, or low-pressure (LP) CVD. The conformal contact spacer layer 34 may be formed of two layers, comprising a lower contact spacer layer 31 of silicon oxynitride formed by PE-CVD at a temperature of less than about 500° C., and an upper contact spacer layer 33 of silicon nitride formed by LP-CVD at a temperature greater than about 500° C.

Figure 7:
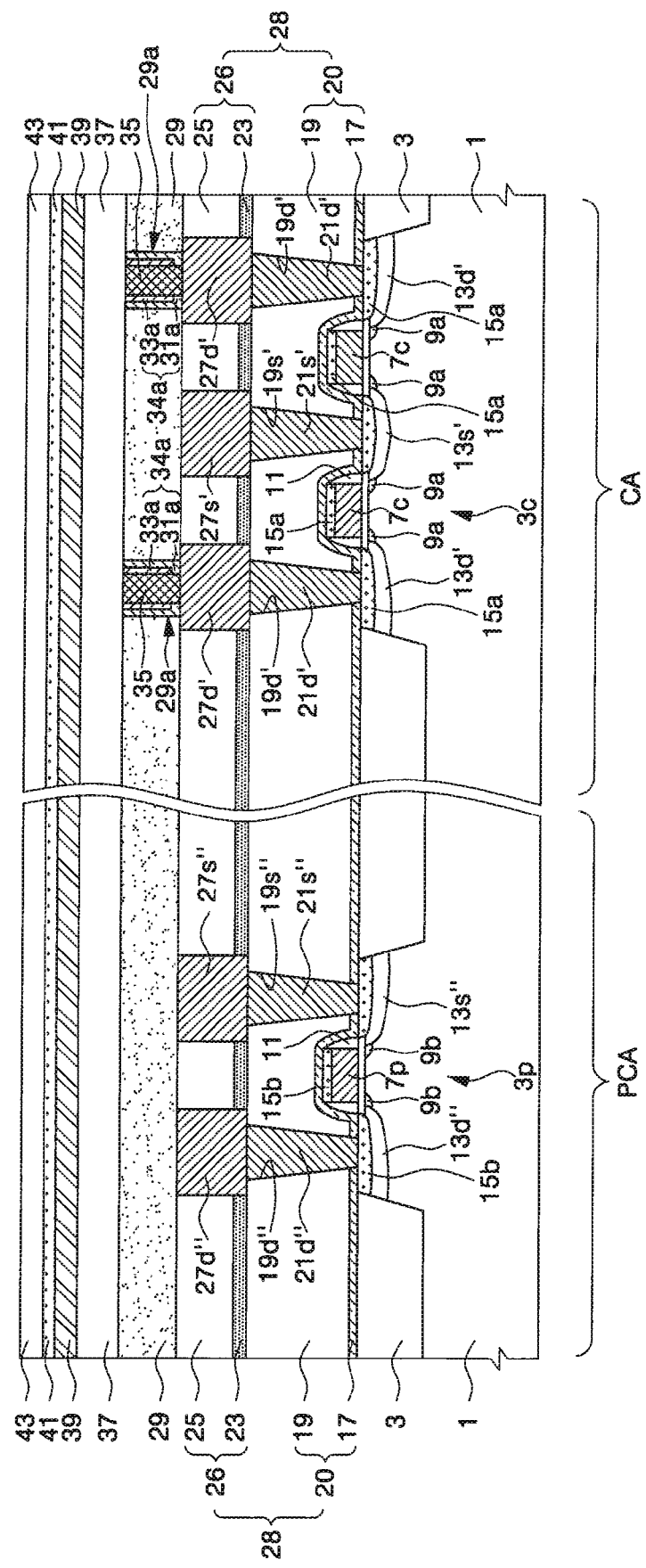

Referring to FIG. 7, the conformal contact spacer layer 34 is anisotropically etched to expose the first drain pad 27d'. As a result, a contact spacer 34a including an inner contact spacer 31a and an outer contact spacer 33a, is formed. The outer contact spacer 33a surrounds an outer wall of the inner contact spacer 31a.

Then, a lower electrode 35 is formed in the phase-change resistor contact hole 29a within the contact spacer 34a. However, depending on the application, the contact spacer 34a may not be necessary. The lower electrode 35 is electrically connected to the first drain pad 27', which is in turn electrically connected to the first drain region 13d' of the switching transistor TA through first contact plug 21d'. In detail, the lower electrode 35 in the phase-change resistor contact hole 29a may be formed by depositing a conductive film such as a TiN film, or a TiAlN film overlying the molding layer 29 and within the contact hole 29a and by planarizing the conductive film until the molding layer 29 is exposed. As a result, the contact spacer 34a surrounds the sidewall of the lower electrode 35.

Subsequently, a phase-changeable material layer 37, an upper electrode layer 39, a glue layer 41, and a hard mask layer 43 are sequentially formed on the resulting structure including the molding layer 29. The hard mask layer 43 may be formed of SiO₂. The glue layer 41 may be a wetting layer such as SiN. One skilled in the art will, however, understand that the above-described structure is only a preferred embodiment and other suitable structures can also be used within the spirit and scope of the present invention. For example, the hard mask layer 43 can be formed using a dielectric material other than $SiO_2$.

The phase-changeable material layer 37 may be formed of a chalcogenide material, including, but not limited to, a GeSbTe alloy, or a Si or N doped GeSbTe alloy, with a thickness of, for example, about 1000 Å.

Figure 8:
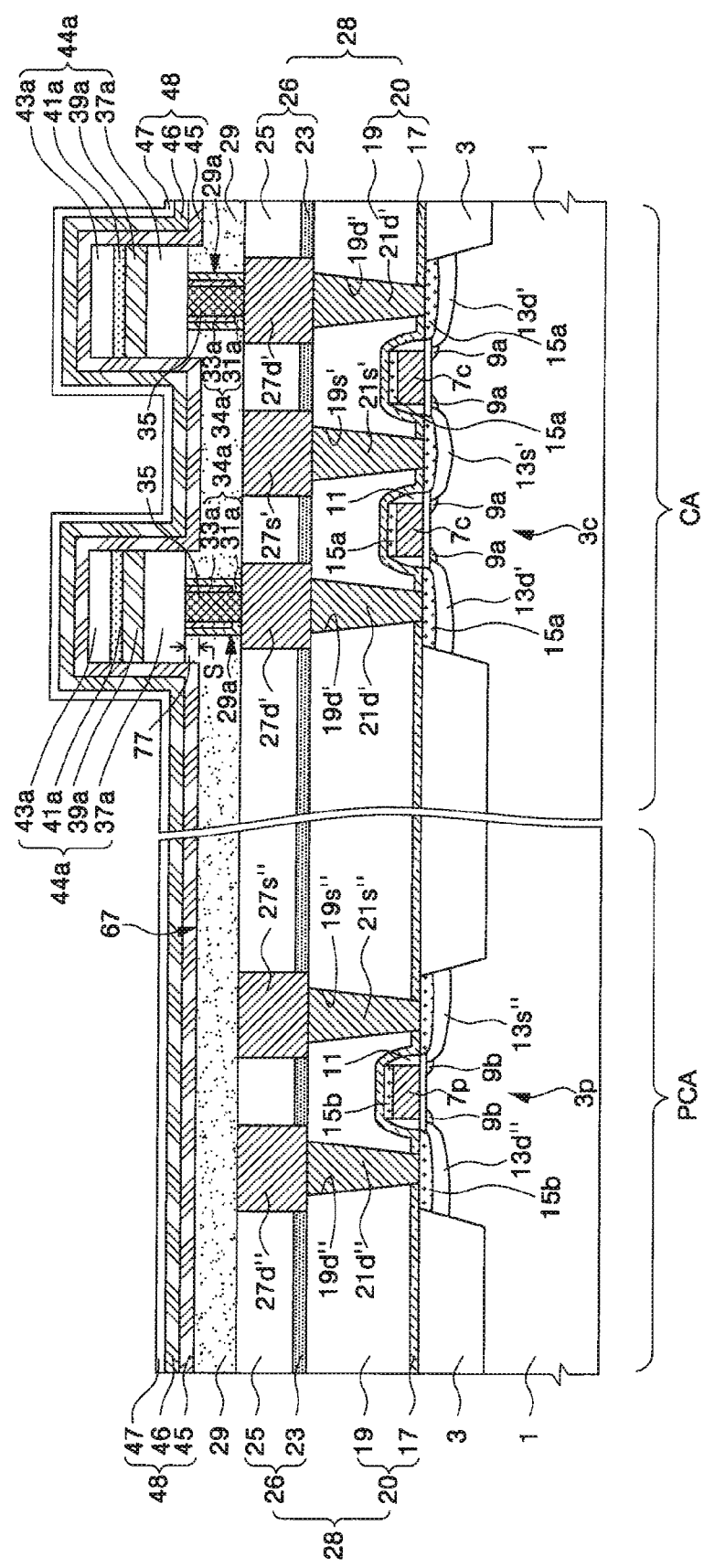

In FIG. 8, a phase-change resistor 44a may be formed by patterning the hard mask layer 43, the glue layer 41, the upper electrode layer 39, and the phase-changeable material layer 37 to form a hard mask layer pattern 43a, an upper electrode 39a, and a phase-changeable material pattern 37a, and then etching an upper portion of the molding layer 29 to thereby be completely separated from an adjacent phase-changeable material pattern 37a. This process also creates a protrusion portion 77 of the molding layer 29 that is self-aligned with the phase-change resistor 44a. The protrusion portion 77 of the molding layer 29 results in a surface step difference indicated by symbol "S," shown in FIG. 8. The phase-changeable material pattern 37a is electrically connected to the lower electrode 35.

Next, an oxidation barrier layer 48 may cover the resulting structure including the phase-change resistor 44a. The oxidation barrier layer 48 may comprise a single layer of nitride, for example, silicon nitride or silicon oxynitride, deposited using a PE-CVD process, or an atomic layer deposition (ALD) process at less than or equal to about 350° C. Alternatively, the oxidation barrier layer 48 may be formed of double layers, comprising a lower oxidation barrier layer 45 of nitride, such as silicon nitride or silicon oxynitride, deposited using a PE-CVD process or an ALD process conducted at a temperature of less than or equal to about 350° C.; and an upper oxidation barrier layer 47 of nitride, such as silicon nitride or silicon oxynitride, deposited using a PE-CVD process or an LPCVD process conducted at a temperature higher than or equal to about 350° C.

The oxidation barrier layer 48 prevents the phase-changeable material pattern 37a from being oxidized or contaminated by oxygen or impurities that may penetrate into an interface between the lower electrode 35 and the phase-changeable material pattern 37a, or another interface between the upper electrode 39a and the phase-changeable material pattern 37a during a process such as an oxide deposition (ILD deposition) to cover the phase-change resistor 44a.

Because the oxidation barrier layer 48 covers the sidewalls of the protrusion portion 77 of the molding layer 29, as well as the sidewalls and/or the upper surface of the phase-change resistor 44a, penetration of oxygen into the phase-change resistor 44a can be efficiently blocked.

Additionally, a plasma nitridation process may be performed on the surface of the phase-change resistor 44a, using an N₂ or NH₃ gas, at a temperature of less than or equal to about 350° C. before forming the oxidation barrier layer 48.

Still referring to FIGS. 1B and 8, according to another aspect of the present invention, the oxidation barrier layer 48 may be formed by sequentially stacking a lower oxidation barrier layer 45, a stress buffer layer 46, and an upper oxidation barrier layer 47. The lower oxidation barrier layer 45 may be formed of a nitride layer such as a silicon oxynitride layer or a silicon nitride layer. The upper oxidation barrier layer 47 may be formed of a nitride layer such as a silicon oxynitride layer or a silicon nitride layer, or a metal oxide layer such as an aluminum oxide layer (AlO), a titanium oxide layer (TiO), a zirconium oxide layer (ZrO), a hafnium oxide layer (HfO), or a lanthanum oxide layer (LaO). Further, the stress buffer layer 46 may be formed of a material layer for alleviating the stress applied to the lower oxidation barrier layer 45 due to the presence of the upper oxidation barrier layer 47. For example, the stress buffer layer 46 may be formed of a silicon oxide layer using a plasma CVD technique at a temperature of about 200 to about 400° C.

If the lower oxidation barrier layer 45 is formed at a temperature lower than 350° C. as described above, the lower oxidation barrier layer 45 may be porous. In this case, since an oxygen blocking efficiency of the lower oxidation barrier layer 45 may be lowered, the lower oxidation barrier layer 45 is preferably densified. The densification process may be performed using an annealing technique or a plasma treatment technique. The annealing process may be performed using a nitrogen gas or an ammonia gas as an ambient gas at a temperature of about 400° C., and the plasma treatment process may be performed using a nitrogen gas or an ammonia gas as a plasma source gas at a temperature of about 200 to about 400° C.

The upper oxidation barrier layer 47 may not be in direct contact with the phase-change material layer patterns 37a. Thus, the upper oxidation barrier layer 47 may be formed in consideration of an oxygen blocking performance rather than damage applied to the phase-change material layer patterns 37a. That is, the upper oxidation barrier layer 47 may be formed at a temperature higher than a temperature at which the lower oxidation barrier layer 45 is formed. For example, the upper oxidation barrier layer 47 may be formed using a plasma CVD technique, a low pressure CVD technique or an atomic layer deposition technique at a temperature higher than about 350° C.

In an embodiment of the present invention, the upper oxidation barrier layer 47 may be formed of an aluminum oxide layer using an atomic layer deposition technique. In this case, the aluminum oxide layer is formed using an ozone gas. The ozone gas has a stronger corrosive property than an oxygen gas. Nevertheless, since the phase-change material layer patterns 37a are covered with the lower oxidation barrier layer 45, the damage applied to the phase-change material layer patterns 37a during formation of the upper oxidation barrier layer 47 can be minimized.

In another embodiment of the present invention, a metal oxide layer used as the upper oxidation barrier layer 47 may be formed using a sputtering technique. In this case, the metal oxide layer may be formed by depositing a metal layer using the sputtering technique and oxidizing the metal layer. For example, in the event that the upper oxidation barrier layer 47 is formed of an aluminum oxide layer, the aluminum oxide layer may be formed by depositing an aluminum layer using a sputtering technique and oxidizing the aluminum layer. When the aluminum oxide layer is formed using a sputtering technique and an oxidation process as described above, the aluminum oxide layer may be formed to have a final thickness corresponding to one and half times that of the aluminum layer formed by the sputtering process. For example, if a final target thickness of the aluminum oxide layer employed as the upper oxidation barrier layer 47 is 150 Å, the aluminum oxide layer can be formed by depositing an aluminum layer with a thickness of 100 Å using a sputtering technique and oxidizing the aluminum layer.

The lower oxidation barrier layer 45 may be formed to a thickness of 200 to 1000 Å, and the upper oxidation barrier layer 47 may be formed to a thickness of 10 to 150 Å. Preferably, the lower oxidation barrier layer 45 may be formed to a thickness of 300 to 500 Å, and the upper oxidation barrier layer 47 may be formed to a thickness of 50 to 100 Å.

Other embodiments may omit at least one of the densification process of the lower oxidation barrier layer 45, the formation process of the stress buffer layer 46 and the formation process of the upper oxidation barrier layer 47.

Figure 9:
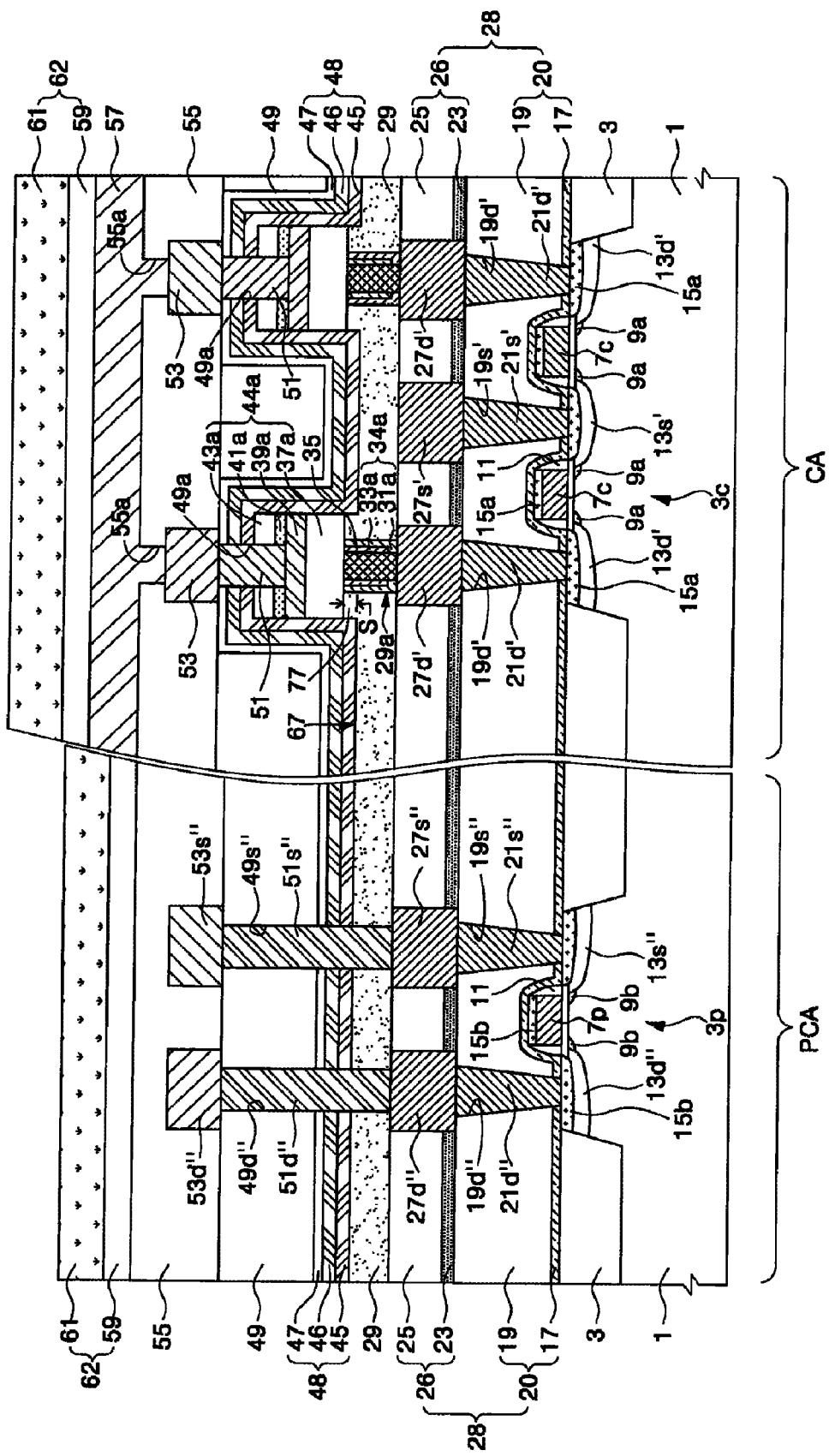

FIG. 9 shows the structure of FIG. 8 with the addition of a lower inter-metal dielectric (IMD) 49, an upper electrode contact hole 49a, an upper peripheral source pad contact hole 49s''', an upper peripheral drain pad contact hole 49d''', an upper electrode contact plug 51, a peripheral upper source plug 51s''', a peripheral upper drain plug 51d''', a bit line pad 53, a source metal line 53s''', a drain metal line 53d''', an upper IMD 55, a bit line contact hole 55a, and a bit line 57. These additional elements are added according to processes known to those familiar in the art.

Next, a passivation layer 62 including a silicon oxide layer 59 and a silicon nitride layer 61 is formed on the resulting structure to complete a phase-change memory device having the oxidation barrier layer 48.

Consequently, the resulting memory device includes a molding layer 29 overlying a semiconductor substrate 1. The molding layer 29 has a protrusion portion 77 vertically extending from a top surface 67 of the molding layer 29. The protrusion portion 77 may have a thickness of at least 100 angstroms, preferably, in a range of about 300 to about 600 angstroms.

The memory device further includes a phase-changeable material pattern 37a adjacent to the protrusion portion 77 and a lower electrode 35 electrically connected to the phase-changeable material pattern 37a. The lower electrode 35 may extend through the protrusion portion 77, preferably along a center portion thereof. The protrusion portion 77 may be located above the first drain pad, i.e., conductive pad 27d'. Further, the phase-changeable material pattern 37a may overlie the protrusion portion 77, although other configurations are also possible as long as the phase-changeable material pattern 37a is adjacent the protrusion portion 77 within the spirit and scope of the present invention. Also, a sidewall of the phase-changeable material pattern 37a may be self-aligned with a sidewall of the protrusion portion 77. The phase-changeable material pattern 37a preferably comprises a chalcogenide material such as a GST (GeSbTe) alloy. According to an aspect of the present invention, the GST alloy may be doped by at least one of silicon and nitrogen.

The device may further include an upper electrode 39a electrically connected to the phase-changeable material pattern 37a.

Also, the device may include an oxidation barrier layer 48 covering at least a portion of a sidewall of the phase-changeable material pattern 37a and at least a portion of a sidewall of the protrusion portion 77. In one aspect, the oxidation barrier layer 48 may cover the phase-changeable material pattern 37a and the upper electrode 39a. More particularly, the oxidation barrier layer 48 preferably covers an area where a sidewall of the phase-changeable material pattern 37a and a sidewall of the protrusion portion 77 adjoin such that penetration of oxygen into the phase-change resistor 44a can be efficiently blocked. Consequently, with the embodiments of the present invention, a more reliable phase-change memory device can be formed in the present invention.

In another aspect of the present invention, the oxidation barrier layer 48 may comprise a first portion overlying a top of the upper electrode 39a and a second portion covering a sidewall of the phase-change layer pattern 37a. Although not illustrated in the drawing, the first portion has a thickness greater than the thickness of the second portion. Preferably, the thickness of the second portion is greater than or equal to about 300 angstroms.

Figure 10:
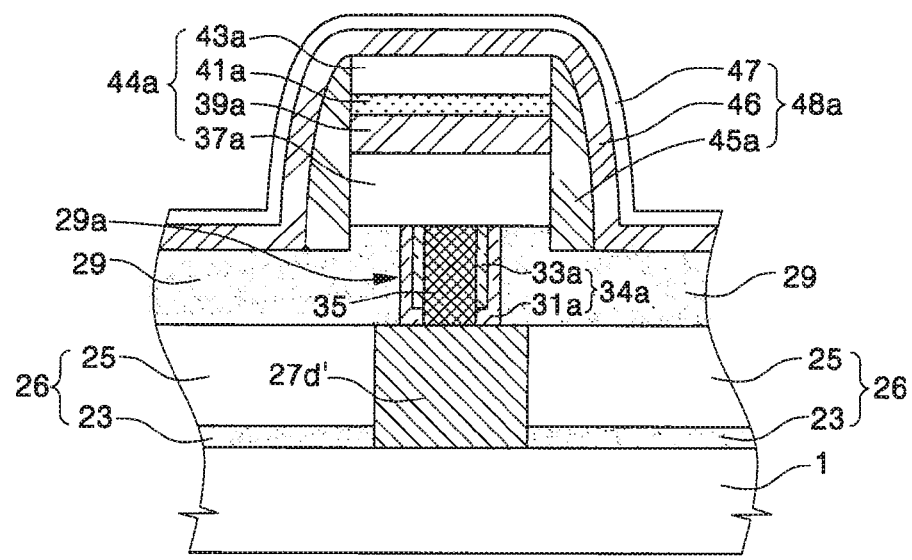
FIG. 10 is a sectional view illustrating a unit cell of a phase-change memory device according to another embodiment of the present invention.

FIG. 10 is a sectional view illustrating methods of fabricating a unit cell of a phase-change memory device according to another embodiment of the present invention. This embodiment is only different from the embodiment illustrated in FIG. 8 for the method of forming the lower oxidation barrier layer, which corresponds to the element 45 of FIG. 8. Therefore, only the method of forming the lower oxidation barrier layer will be described in this embodiment for simplicity.

Referring to FIG. 10, phase-change resistors 44a are formed over a semiconductor substrate 1 using the same method as described with reference to FIGS. 2 to 8. A lower oxidation barrier layer 45 is formed on the substrate 1 having the phase-change resistors 44a using substantially the same method as described with reference to FIG. 8. The lower oxidation barrier layer 45 is anisotropically etched, thereby forming lower oxidation barrier layer patterns 45a having a spacer shape on the sidewalls of the phase-change resistors 44a and on the sidewalls of the protrusions 77. The spacer-shaped lower oxidation barrier layer patterns 45a may be densified using an annealing process or a plasma treatment process as described with reference to FIG. 8. In addition, a stress buffer layer 46 and an upper oxidation barrier layer 47 may be sequentially formed on the spacer-shaped lower oxidation barrier layer patterns 45a. As a result, the spacer-shaped lower oxidation barrier layer patterns 45a, the stress buffer layer 46, and the upper oxidation barrier layer 47 may constitute an oxidation barrier layer 48a.

In this embodiment, at least one of the densification process of the lower oxidation barrier layer patterns 45a, the formation process of the stress buffer layer 46, and the formation process of the upper oxidation barrier layer 47 may also be omitted.

Figure 11:
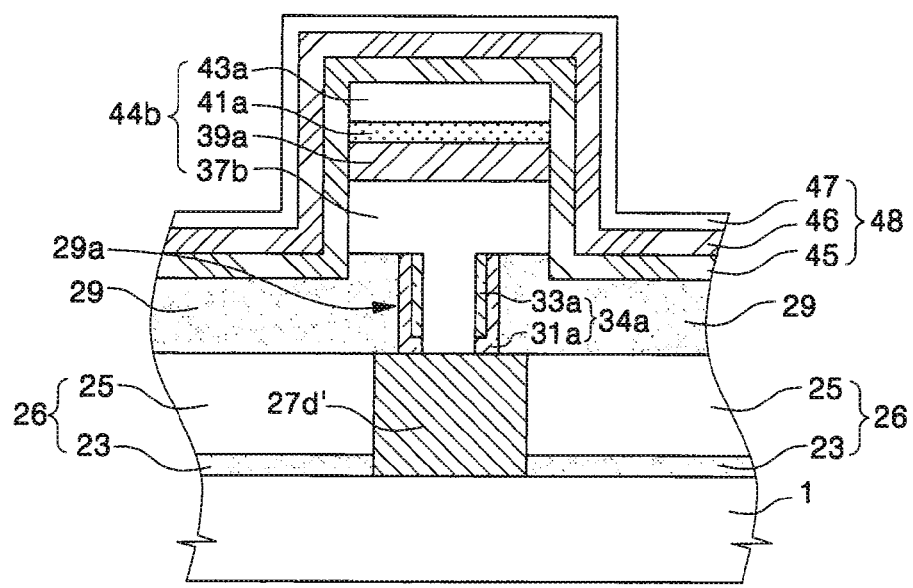
FIG. 11 is a sectional view illustrating a unit cell of a phase-change memory device according to still another embodiment of the present invention.

FIG. 11 is a sectional view illustrating methods of fabricating a unit cell of a phase-change memory device according to still another embodiment of the present invention. This embodiment is different from the embodiment illustrated in FIGS. 7 and 8 in the method of forming the phase-change material layer patterns.

Referring to FIG. 11, a molding layer 29 and a contact spacer layer 34 are formed over a semiconductor substrate 1, using substantially the same method as the embodiments described with reference to FIGS. 2 to 6. The contact spacer layer 34 is anisotropically etched to form contact spacers 34a, if the contact spacers 34a are necessary. Then, a phase-change material layer 37 and an upper electrode layer 39 may be sequentially formed on the resulting structure having the contact spacers 34a without forming the lower electrodes 35 shown in FIG. 7. Then, phase-change resistors 44b and an oxidation barrier layer 48 may be formed using substantially the same methods as described with reference to FIGS. 7 and 8. As a result, each of the phase-change resistors 44b is formed to have a phase-change material layer pattern 37b directly contacting the conductive drain pad 27d' through the phase-change resistor contact hole 29a surrounded by the contact spacers 34a as shown in FIG. 11. That is, confined phase-change memory cells, i.e., the phase-change memory cells confined by the contact spacer 34a, may be formed. Consequently, the phase-change material layer pattern 37b penetrates the protrusion portion 77 (refer to FIG. 9). In this case, the conductive drain pad 27d' may function as a lower electrode of the phase-change resistor 44b.

Figure 12:
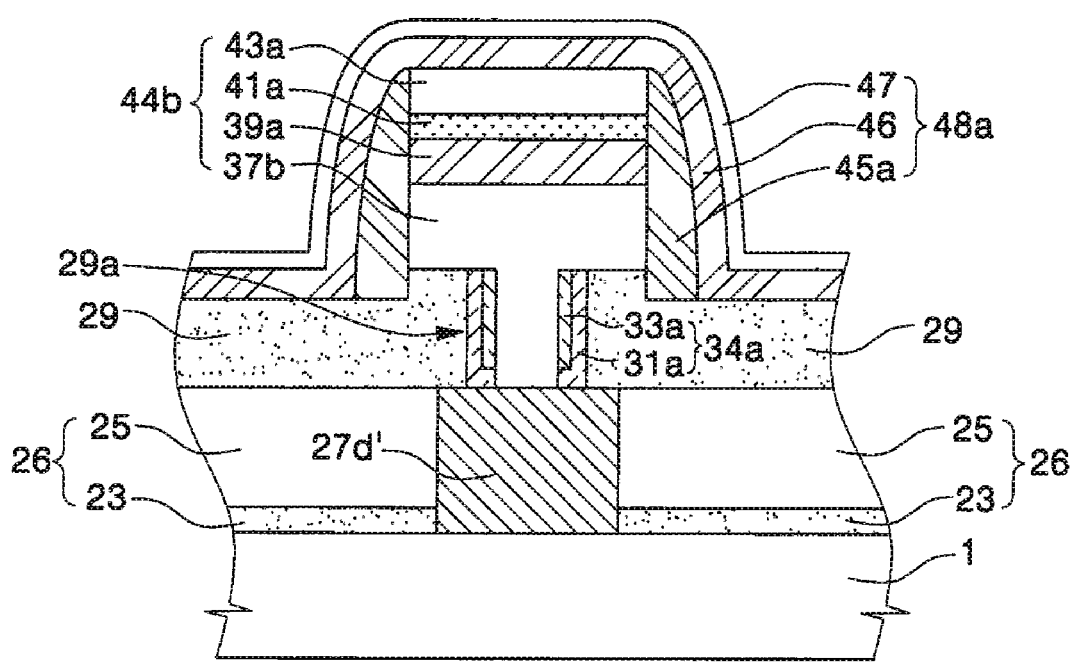
FIG. 12 is a sectional view illustrating a unit cell of a phase-change memory device according to yet another embodiment of the present invention.

FIG. 12 is a sectional view illustrating methods of fabricating a unit cell of a phase-change memory device according to still another embodiment of the present invention. This embodiment is a combination of the embodiments shown in FIGS. 10 and 11.

Referring to FIG. 12, confined phase-change resistors 44b are formed over a semiconductor substrate 1 using substantially the same method as described with reference to FIG. 11. An oxidation barrier layer 48a is formed on the substrate 1 having the confined phase-change resistors 44b using substantially the same methods as described with reference to FIG. 10.

Figure 13:
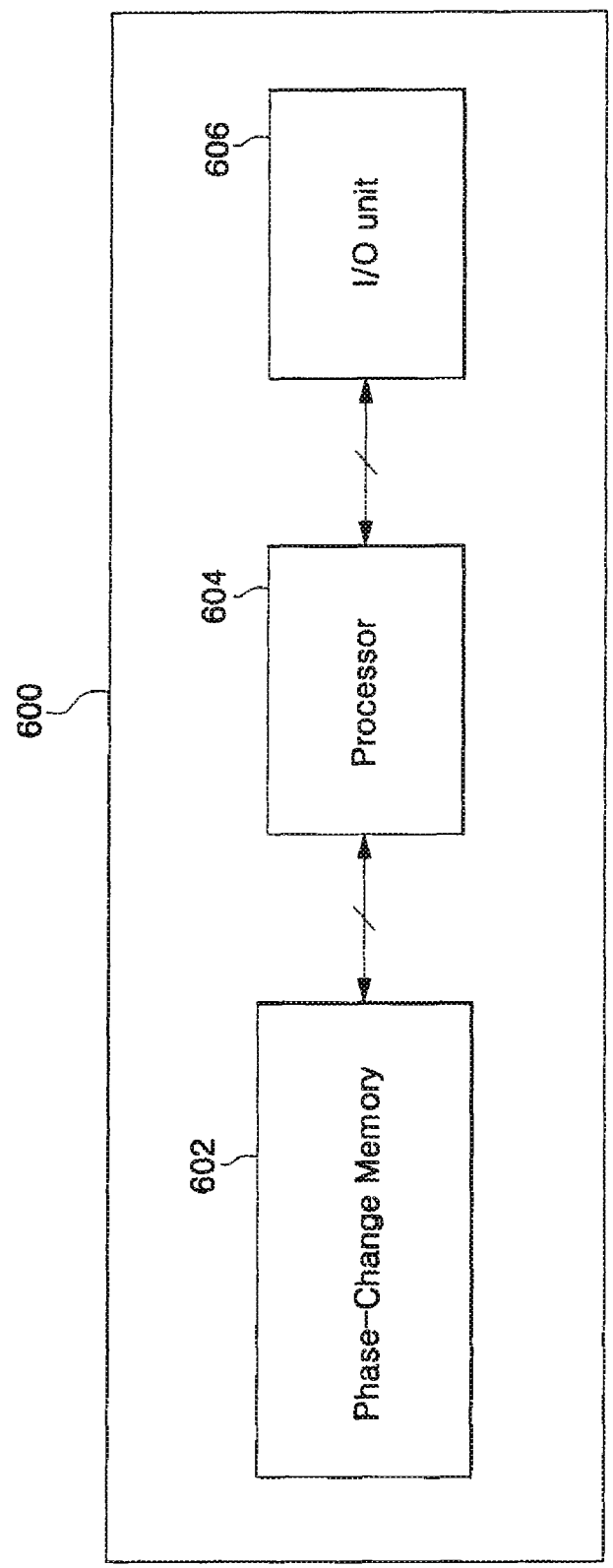
FIG. 13 is a schematic block diagram of a portable electronic apparatus adopting an embodiment of a phase-change memory device of the invention.

FIG. 13 shows a typical application of an embodiment of the invention. A portable electronic apparatus 600, such as a cell phone, utilizes a phase-change memory device 602 in conjunction with a processor 604 and an input/output device 606.

Figure 14:
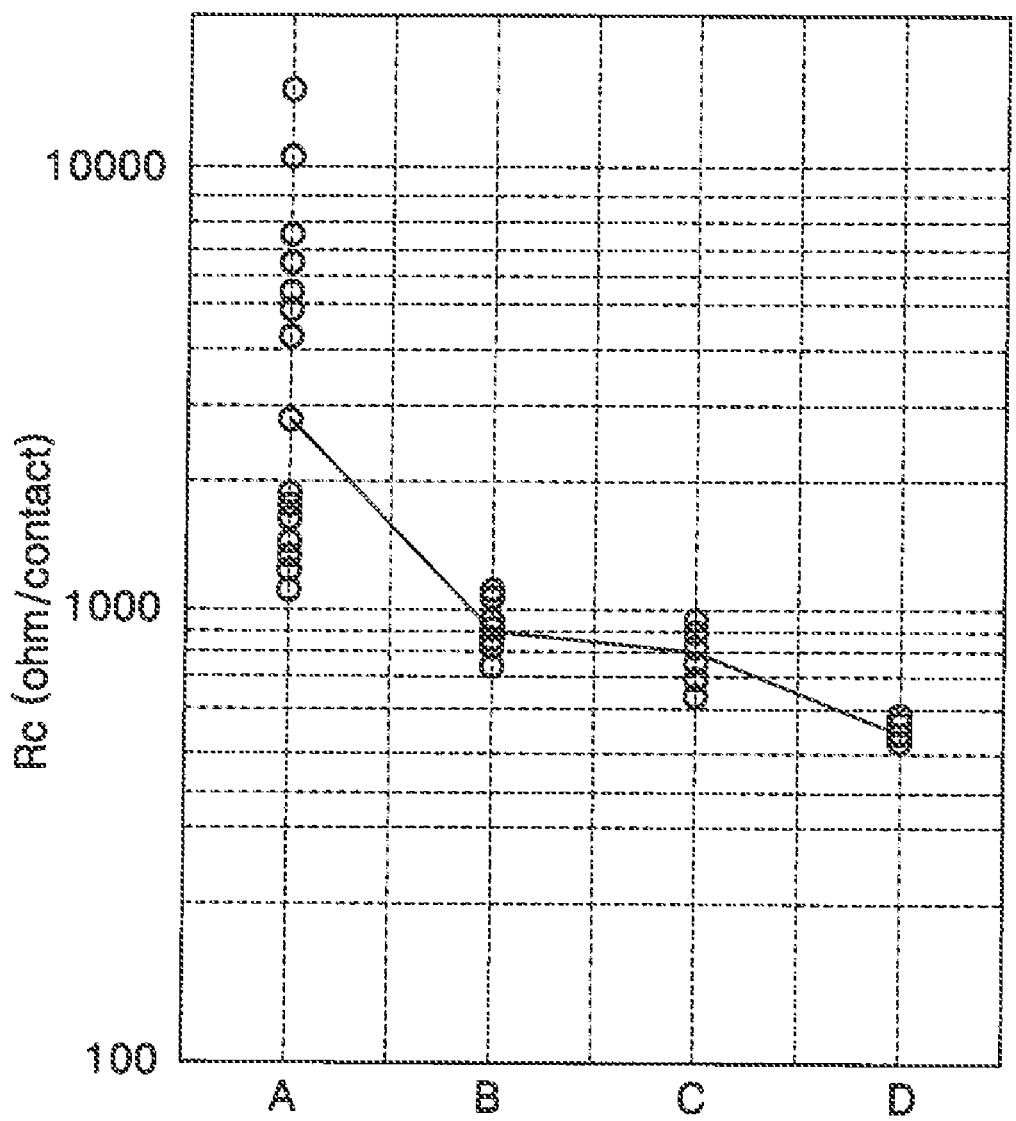
FIG. 14 is a graph showing the lower electrode contact resistance characteristic between a phase-changeable material and a lower electrode of the phase-change resistors manufactured according to embodiments of the present invention.

FIG. 14 is a plot showing a distribution of contact resistances for four samples, A, B, C, and D shown in Table 1 below.

| process parameter | Prior art sample A | Some of the examples of the present invention | | |
|---|---|---|---|---|
| | | sample B | sample C | sample D |
| molding layer | | silicon oxynitride (SiON) | | |
| outer contact spacer | | silicon oxynitride (SiON; plasma CVD) | | |
| Inner contact spacer | | silicon nitride (SiN; LP CVD) | | |
| lower electrode | | titanium nitride (TiN), diameter: 50 nm | | |
| phase-change material | | GeSbTe alloy | | |
| upper electrode | | titanium (TiN) | | |
| oxidation barrier | None | SiON layer (200° C., PECVD, 200 Å) | SiN layer (200° C., PECVD, 200 Å) | lower SiN layer (200° C., PECVD, 200 Å) upper SiN layer (400° C., PECVD, 200 Å) |

Sample A does not include an oxidation barrier layer, in contrast with the embodiments of the present invention. In FIG. 14 it is easy to see that the contact resistance for sample A has a much greater distribution than those of samples B, C, and D, each of which includes an oxidation barrier of various embodiments of the present invention.

Specifically, sample B comprises a SiON layer, sample C comprises an SiN layer, and sample D comprises a lower and an upper oxidation barrier layer, each of SiN. For sample B, the SiON layer is formed using a PECVD process conducted at a temperature 200° C., to a thickness of 200 Å. For sample C, the SiN layer is formed the same way as for sample B. For sample D, both SiN layers are formed as for samples B and C, except the upper layer is processed at 400° C.

FIG. 14 demonstrates the improvement over the conventional art, e.g., sample A, with the lower electrode contact resistances of phase-change resistors of samples B, C, and D showing very uniform distribution characteristics. The sample D among the samples manufactured by the invention has the most stable distribution characteristic.

Figure 15:
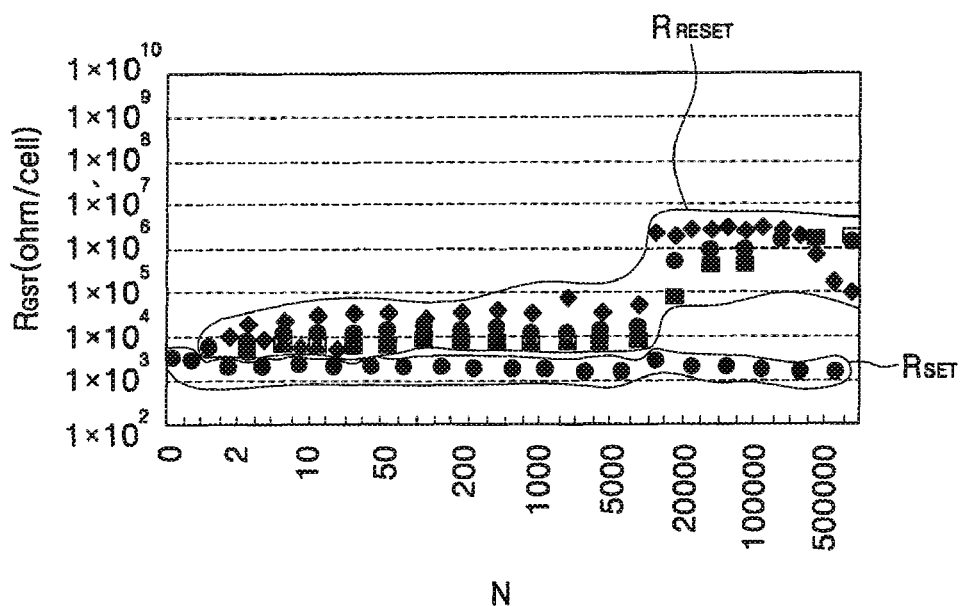
FIG. 15 is a graph showing programming characteristics of a conventional phase-change memory device without an oxidation barrier layer.

FIG. 15 is a graph showing programming characteristics of a conventional phase-change memory device without an oxidation barrier layer.

Up to about 5,000 programming cycles, a conventional phase-change memory device has a very low reset resistance value of 6,000-100,000Ω, as compared with a set resistance value. Thus it is difficult to get enough sensing margin to read the memory cell information accurately.

Figure 16:
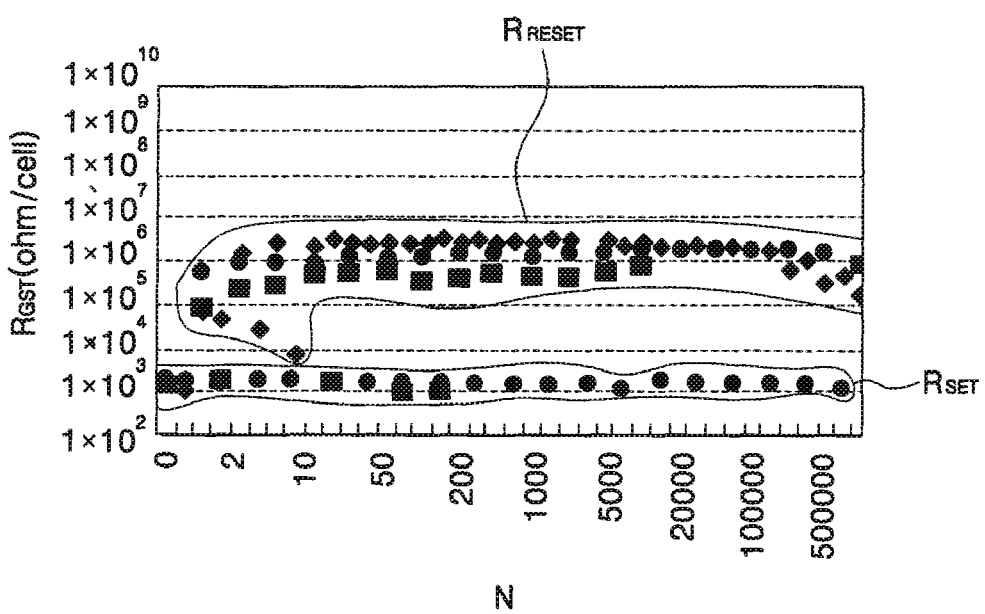
FIG. 16 is a graph showing programming characteristics of a phase-change memory device of an embodiment of the invention with an oxidation barrier layer.

FIG. 16 is a graph showing programming characteristics of a phase-change memory device of an embodiment of the present invention with an oxidation barrier layer. After 10 programming cycles, the phase-change memory device according to an embodiment of the invention has a very high reset resistance value of 30,000-3,000,000Ω as compared with a set resistance value. Thus it has a very high sensing margin.

Comparing FIGS. 15 and 16, one can see that the interface region acting as a programming region of a phase-changeable material layer pattern of the present invention with an oxidation barrier layer has a better quality than that of a conventional phase-changeable material layer pattern.

EXAMPLES

Figure 17:
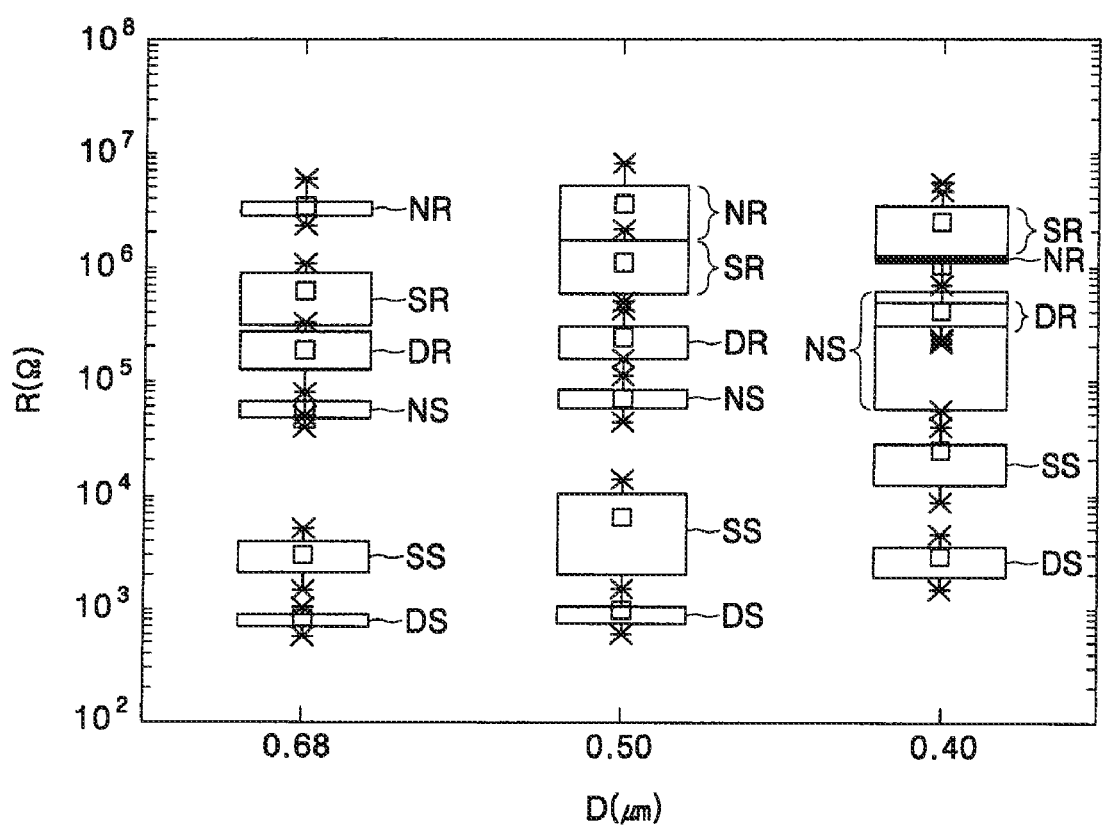
FIG. 17 is a graph illustrating set/reset resistance characteristics of the phase-change memory cells fabricated according to the present invention and the conventional art.

FIG. 17 is a graph illustrating set/reset resistance characteristics of the phase-change memory cells fabricated according to the present invention and the conventional art. In FIG. 17, a horizontal axis represents a diameter D of the phase-change material patterns, and a vertical axis represents a resistance R of the phase-change resistors. In the graph of FIG. 17, the data indicated by reference letters "NR" and "NS" represent a reset resistance and a set resistance of the conventional phase-change resistors fabricated without an oxidation barrier layer, respectively. The data indicated by reference letters "SR" and "SS" represent a reset resistance and a set resistance of the phase-change resistors covered with a single oxidation barrier layer, respectively. Further, the data indicated by reference letters "DR" and "DS" represent a reset resistance and a set resistance of the phase-change resistors covered with a double oxidation barrier layer, respectively. The phase-change resistors exhibiting the measurement results of FIG. 17 were fabricated using the process conditions listed in the following Table 2.

TABLE 2

| | | Present invention | |
|---|---|---|---|
| Process parameters | Conventional art | single barrier layer | double barrier layer |
| molding layer | | silicon oxynitride layer (SiON) | |
| lower electrode | | titanium nitride layer (TiN), diameter (50 nm) | |
| phase-change material layer | | GST alloy layer (GeSbTe alloy layer) | |
| upper electrode | | titanium nitride layer (TiN) | |
| oxidation barrier layer | None | SiN layer, 500 Å, PECVD | lower barrier layer (SiN layer, 500 Å, PECVD) upper barrier layer (AlO layer, 50 Å, ALD) |

Referring to FIG. 17 and Table 2, a difference between a set resistance and a reset resistance of the conventional phase-change resistors was gradually reduced with a reduction of the diameter D of the phase-change material pattern. For example, when the diameter D of the phase-change material pattern was reduced from 0.68 μm to 0.4 μm, a reset/set resistance ratio of the conventional phase-change resistors is abruptly reduced from about $1.6 \times 10^2$ to about $0.5 \times 10$. Further, the conventional phase-change resistor having the phase-change material pattern with a diameter of 0.4 μm exhibited a non-uniform set resistance of about $6 \times 10^4 \Omega$ to about $7 \times 10^5 \Omega$.

On the other hand, a reset/set resistance ratio of the phase-change resistors covered with a single oxidation barrier layer was decreased from about $1.6 \times 10^2$ to about $1 \times 10^2$, when the diameter D of the phase-change material pattern was reduced from 0.68 μm to 0.4 μm. Further, a reset/set resistance ratio of the phase-change resistors covered with a double oxidation barrier layer was decreased from about $2.5 \times 10^2$ to about $1.3 \times 10^2$, when the diameter D of the phase-change material pattern was reduced from 0.68 μm to 0.4 μm. Particularly, the phase-change resistors covered with a single oxidation barrier layer or a double oxidation barrier layer and having the phase-change material pattern with a diameter of 0.4 μm exhibited a more uniform set resistance compared to the conventional phase-change resistors having the phase-change material pattern with a diameter of 0.4 μm.

Although the invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. A semiconductor memory device comprising:
   a semiconductor substrate;
   a molding layer disposed over the semiconductor substrate, the molding layer having a top surface, and a protrusion extending vertically from the top surface;
   a phase-changeable material pattern having one portion thereof overlying the protrusion of the molding layer, and another portion thereof extending through the protrusion of the molding layer; and
   an oxidation barrier comprising electrically insulative material covering the phase-changeable material pattern and the protrusion of the molding layer,
   wherein the oxidation barrier comprises a lower oxidation barrier spacer of electrically insulative material that extends along and covers a sidewall of the phase-change material pattern and a sidewall of the protrusion portion, an upper oxidation barrier layer of electrically insulative material, and a stress-alleviating buffer layer sandwiched between opposing surfaces of the lower oxidation barrier spacer and the upper oxidation barrier layer.

2. The device of claim 1, further comprising a contact spacer surrounding another portion of the phase-changeable material pattern.

3. The device of claim 2, wherein the contact spacer is disposed between the molding layer and another portion of the phase-changeable material pattern.

4. The device of claim 1, wherein the lower spacer of the oxidation barrier comprises a nitride, the upper oxidation barrier layer is a nitride layer or a metal oxide layer, and the stress buffer layer is a silicon oxide layer.

5. The device of claim 1, wherein the electrically insulative material of the oxidation barrier extends along and covers the sidewall of said one portion of the phase-change material pattern, the sidewall of the protrusion of the molding layer, and an entire area at which said one portion of the phase-change material pattern and the protrusion of the molding layer adjoin.

6. The device of claim 5, wherein the electrically insulative material of the oxidation barrier conforms to the underlying topography of the device.

7. A semiconductor memory device comprising:
   a semiconductor substrate;
   a molding layer disposed over the semiconductor substrate, the molding layer having a top surface, and a protrusion extending vertically from the top surface of the molding layer;
   a phase-changeable material pattern having one portion thereof overlying the protrusion of the molding layer, and another portion thereof extending through the protrusion of the molding layer, and
   an oxidation barrier comprising electrically insulative material extending along and covering at least an area at which said one portion of the phase-change material pattern and the protrusion of the molding layer adjoin,
   wherein the oxidation barrier comprises a lower oxidation barrier spacer of electrically insulative material that extends along and covers a sidewall of the phase-change material pattern and a sidewall of the protrusion, an upper oxidation barrier layer of electrically insulative material, and a stress-alleviating buffer layer sandwiched between opposing surfaces of the lower oxidation barrier spacer and the upper oxidation barrier layer.

8. The device of claim 7, wherein the lower spacer of the oxidation barrier comprises a nitride, the upper oxidation barrier layer is a nitride layer or a metal oxide layer, and the stress buffer layer is a silicon oxide layer.

9. The device of claim 7, further comprising a contact spacer surrounding another portion of the phase-changeable material pattern.

10. The device of claim 9, wherein the contact spacer is disposed between the molding layer and another portion of the phase-changeable material pattern.

11. The device of claim 7, wherein the electrically insulative material of the oxidation barrier extends along and covers the sidewall of said one portion of the phase-change material pattern, and the sidewall of the protrusion of the molding layer.

12. The device of claim 11, wherein the electrically insulative material of the oxidation barrier conforms to the underlying topography of the device.

13. The device of claim 12, further comprising dielectric material disposed against and covering the oxidation barrier.

14. The device of claim 7, wherein the top surface of the molding layer is opposite the semiconductor substrate, and the protrusion extends vertically from the top surface of the molding layer in a direction away from the semiconductor substrate.

15. A semiconductor memory device comprising:
   a semiconductor substrate;
   a molding layer disposed over the semiconductor substrate, the molding layer having a top surface, a bottom surface, a protrusion extending vertically from the top surface so as to have a sidewall and an upper surface, and a contact hole extending through the protrusion from the upper surface thereof;
   a pattern of phase-changeable material self-aligned with the protrusion of the molding layer,
   wherein the pattern of phase-changeable material has an upper portion disposed on the protrusion of the molding layer, the upper portion having a sidewall whose contour is substantially the same as the contour of the sidewall of the protrusion of the molding layer, and
   wherein the pattern of phase-changeable material has a lower portion extending from the upper portion into the contact hole of the molding layer and through the protrusion of the molding layer by way of the contact hole; and
   an oxidation barrier comprising electrically insulative material covering at least part of the upper portion of the pattern of phase-changeable material, and the electrically insulative material conforming to the underlying topography of the device.

16. The device of claim 15, wherein the electrically insulative material of the oxidation barrier extends contiguously along and covers both the sidewall of the upper portion of the pattern of the phase-change material and the sidewall of the protrusion of the molding layer.

17. The device of claim 16, wherein the electrically insulative material of the oxidation barrier also extends contiguously from the sidewall of the upper portion of the pattern of the phase-change mat over at least part of the top surface of the upper portion the pattern of phase-changeable material.

18. The device of claim 15, wherein the molding layer is a nitride layer.

19. The device of claim 15, wherein the electrically insulative material of the oxidation barrier comprises a nitride layer.

20. The device of claim 15, further comprising dielectric material disposed against and covering the oxidation barrier.

* * * * *